United States Patent
Kim et al.

(10) Patent No.: US 8,497,703 B2
(45) Date of Patent: Jul. 30, 2013

(54) RECONFIGURABLE LOGIC DEVICES

(75) Inventors: Ho-jung Kim, Suwon-si (KR);
Jai-kwang Shin, Anyang-si (KR);
Hyun-sik Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 15 days.

(21) Appl. No.: 13/080,938

(22) Filed: Apr. 6, 2011

(65) Prior Publication Data

US 2012/0054417 A1 Mar. 1, 2012

(30) Foreign Application Priority Data

Aug. 25, 2010 (KR) .................. 10-2010-0082645

(51) Int. Cl.
*G06F 7/38* (2006.01)
(52) U.S. Cl.
USPC ............................................................ 326/39
(58) Field of Classification Search
USPC .............................................. 326/37–47, 101
See application file for complete search history.

(56) References Cited

U.S. PATENT DOCUMENTS

| | | | |
|---|---|---|---|
| 6,542,000 B1 | 4/2003 | Black et al. | |
| 6,876,228 B2 | 4/2005 | Sunaga et al. | |
| 7,365,355 B2 | 4/2008 | Parkinson | |
| 7,499,315 B2 | 3/2009 | Lowrey et al. | |
| 7,710,147 B1 * | 5/2010 | White et al. | 326/38 |
| 2010/0039136 A1 | 2/2010 | Chua-Eoan et al. | |
| 2010/0073025 A1 | 3/2010 | Tanamoto et al. | |
| 2010/0079165 A1 * | 4/2010 | Bertin et al. | 326/38 |

* cited by examiner

*Primary Examiner* — Thienvu Tran
(74) *Attorney, Agent, or Firm* — Harness, Dickey & Pierce, P.L.C.

(57) ABSTRACT

Example embodiments provide a reconfigurable logic device including at least two logic blocks having a first logic block and a second logic block, a global wire group including at least a plurality of first global wires connected to the first logic block and a plurality of second global wires connected to the second logic block, and a global controller including a plurality of first nonvolatile memory devices associated with at least one first global wire and one second global wire, the global controller configured to selectively couple the pluralities of first and second global wires based on first data stored in the associated first nonvolatile memory devices.

26 Claims, 8 Drawing Sheets

RECONFIGURABLE LOGIC DEVICES

CROSS-REFERENCE TO RELATED APPLICATIONS

This application claims priority under 35 U.S.C. §119 to Korean Patent Application No. 10-2010-0082645, filed on Aug. 25, 2010, in the Korean Intellectual Property Office, the disclosure of which is incorporated herein in its entirety by reference.

BACKGROUND

1. Field

The present disclosure relates to logic devices, and more particularly, to a reconfigurable logic device that is reconfigurable in real time by using non-volatile memory devices.

2. Description of the Related Art

Recently, use of reconfigurable logic devices, such as programmable logic devices (PLDs), which can be designed arbitrarily by a user, have been widespread. A user may perform a desired operation by reconfiguring a logic device by controlling a connection among wires included in the logic device.

SUMMARY

Provided are reconfigurable logic devices that are reconfigurable in real time by using non-volatile memory devices.

Additional aspects will be set forth in part in the description which follows and, in part, will be apparent from the description, or may be learned by practice of the presented embodiments.

According to an aspect of the example embodiments, a logic device includes at least two logic blocks including a first logic block and a second logic block, a global wire group including at least a plurality of first global wires connected to the first logic block and a plurality of second global wires connected to the second logic block, and a global controller including a plurality of first nonvolatile memory devices associated with at least one first global wire and one second global wire, the global controller configured to selectively couple the pluralities of first and second global wires based on first data stored in the associated first nonvolatile memory devices.

The global controller may include a global wire connection unit including the plurality of first nonvolatile memory devices, the global wire connection unit configured to connect the plurality of first global wires to the plurality of second global wires, and a global wire connection controller configured to control the global wire connection unit by programming the plurality of first nonvolatile memory devices in real time.

Each of the at least two logic blocks may include at least two functional blocks including a first functional block and a second functional block, a local wire group including a plurality of first local wires connected to the first functional block, and a plurality of second local wires connected to the second functional block, and a local controller including a plurality of second nonvolatile memory devices associated with at least one first local wire and second local wire, the local controller configured to selectively couple the pluralities of first and second local wires based on second data stored in the associated of second nonvolatile memory devices.

The local controller may include a local wire connection unit including the plurality of second nonvolatile memory devices, the local wire connection unit configured to connect the plurality of first local wires to the plurality of second local wires, and a local wire connection controller configured to control the local wire connection unit by programming the plurality of second nonvolatile memory devices.

The local wire connection unit may be located above the local wire connection controller. Otherwise, the local wire connection unit may be located below the local wire connection controller.

The global wire connection unit may include a plurality of switching units coupled to the plurality of first global wires and the plurality of second global wires, respectively. Each of the plurality of switching units may include a switch, a switch controller including at least one of the plurality of first nonvolatile memory devices, the switch controller configured to control switching of the switch.

The global wire connection controller may be connected to at least one of the switch controllers.

The global wire connection controller may include a plurality of write decoders connected to switch controllers adjacent to each other in a first direction, and a wire driver connected to the plurality of write decoders.

The switch controller may include a latch configured to read and store the first data. Otherwise, the switch controller may further include a latch configured to read and store the first data stored in at least one pair of first nonvolatile memory devices from among the plurality of first nonvolatile memory devices.

The latch may include a first inverter including a first pull-up transistor connected to a power supply voltage terminal, and a first pull-down transistor connected to the first pull-up transistor in series, a second inverter including a second pull-up transistor connected to the power supply voltage terminal, and a second pull-down transistor connected to the second pull-up transistor in series, the second inverter being cross-coupled to the first inverter, and an equalizer configured to connect a gate of the first pull-down transistor to a gate of the second pull-down transistor, based on an equalization signal.

The at least one pair of first nonvolatile memory devices may be connected between a source of the first pull-down transistor and a ground voltage terminal and between a source of the second pull-down transistor and the ground voltage terminal, respectively.

A node between the second pull-up transistor and the second pull-down transistor may be connected to a control terminal of the switch, and an open state of the switch being based on a voltage of the node. The switch controller may further include a first switch transistor connected to a source of the first pull-down transistor, and a second switch transistor connected to a source of the second pull-down transistor.

The global wire connection controller may include a first write decoder connected to the plurality of first switch transistors, a second write decoder connected to the plurality of second switch transistors, and a write driver connected to the first and second write decoders.

The local connection controller is configured to program the plurality of second nonvolatile memory devices and switch a connection between the plurality of first local wires and the plurality of second local wires based on the programming of the plurality of second nonvolatile memory devices, respectively. The local wire connection controller may include a plurality of write decoders connected to the plurality of first local wires, respectively, and a write driver being commonly connected to the plurality of write decoders.

The plurality of first nonvolatile memory devices may include resistive memory devices, magnetic memory devices, or flash memory devices. The plurality of second nonvolatile memory devices may include resistive memory devices, wherein the differences between resistances of the resistive memory devices if the resistive memory devices may be programmed to a first logic state (e.g., '1') and resistances of the resistive memory devices if the resistive memory devices are programmed to a second logic state (e.g., '0'), respectively, may be greater than a value.

According to another aspect of the example embodiments, a logic device includes at least two logic blocks including a first logic block and a second logic block, and a global controller including a plurality of first nonvolatile memory devices and a plurality of switches associated with one of a plurality of first global wires connected to the first logic block and one of a plurality of second global wires connected to the second logic block, respectively, the global controller configured to selectively couple the plurality of first and second global wires by controlling the plurality of switches, based on first data stored in the plurality of first nonvolatile memory devices. Each of the at least two logic blocks may include at least two functional blocks having a first functional block and a second functional block, and a local controller having a plurality of second nonvolatile memory devices associated with at least one of a plurality of first local wires connected to the first functional block and one of a plurality of second local wires connected to the second functional block, the local controller configured to selectively couple the pluralities of first and second local wires, based on second data stored in the associated plurality of second nonvolatile memory devices.

The global controller may include a global wire connection unit including the plurality of first nonvolatile memory devices, the global unit wire connecting unit configured to connect the plurality of first global wires to the plurality of second global wires, and a global wire connection controller configured to control the global wire connection unit by programming the plurality of first nonvolatile memory devices.

The local controller may include a local wire connection unit including the plurality of second nonvolatile memory devices, the local wire connection unit configured to connect the plurality of first local wires to the plurality of second local wires, and a local wire connection controller configured to control the local wire connection unit by programming the plurality of second nonvolatile memory devices.

The local wire connection unit is located above the local wire connection controller. Otherwise, the local wire connection unit may be located below the local wire connection controller.

The global controller may further include a plurality of latches configured to read and store the plurality of pieces of first data stored in the plurality of first nonvolatile memory devices, respectively.

The plurality of first nonvolatile memory devices may include resistive memory devices, magnetic memory devices, or flash memory devices. The plurality of second nonvolatile memory devices may include resistive memory devices, wherein the differences between resistances of the resistive memory devices when the resistive memory devices are programmed to a first logic state and resistances of the resistive memory devices when the resistive memory devices are programmed to a second logic state, respectively, are greater than a value.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
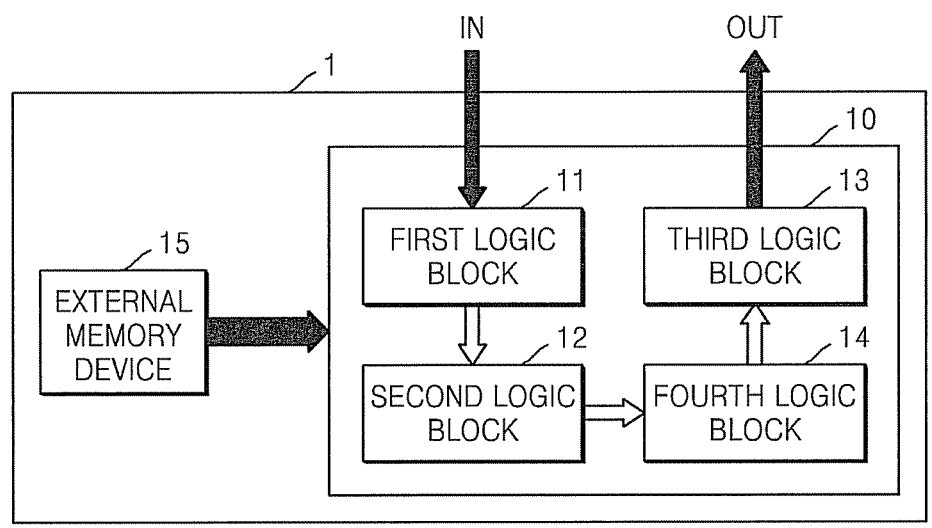
FIG. 1 is a schematic block diagram of an electronic circuit module that includes a general logic device and an external memory device.

The attached drawings for illustrating example embodiments are referred to in order to gain a sufficient understanding of inventive concepts, the merits thereof, and objectives accomplished by the implementation of example embodiments.

Hereinafter, inventive concepts will be described in detail by explaining example embodiments with reference to the attached drawings. In the drawings, lengths and sizes of layers and regions may be exaggerated for clarity. Like reference numerals in the drawings denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of an electronic circuit module 1 that includes a general logic device 10 and an external memory device 15. Referring to FIG. 1, the electronic circuit module 1 includes the logic device 10 having a plurality of logic blocks 11, 12, 13, and 14, and the external memory device 15. The logic device 10 is a Programmable Logic Device (PLD), e.g., a Field Programmable Gate Array (FPGA), a Programmable Array Logic (PAL), a Programmable Logic Array (PLA), or, a Generic Array Logic (GAL). The external memory device 15 stores connection information regarding a connection among wires of the plurality of logic blocks 11 to 14 included in the logic device 10. Examples of the external memory device 15 include flash memory or read only memory (ROM).

When power is supplied to the electronic circuit module 1, the connection information stored in the external memory device 15 is loaded to the logic device 10. Thus, the plurality of logic blocks 11 to 14 are connected to one another according to the connection information, and an operation of the logic device 10 are defined based on a connection among the plurality of logic blocks 11 to 14. Thus, in order to define an operation of the logic device 10, the connection information may be programmed in advance, stored in the external memory device 15, and loaded to the logic device 10. Thus, it is difficult to reconfigure the logic device 10 in real time. Also, the external memory device 15 is needed to operate the logic device 10, thereby increasing the size and manufacturing costs of the electronic circuit module 1.

Figure 2:
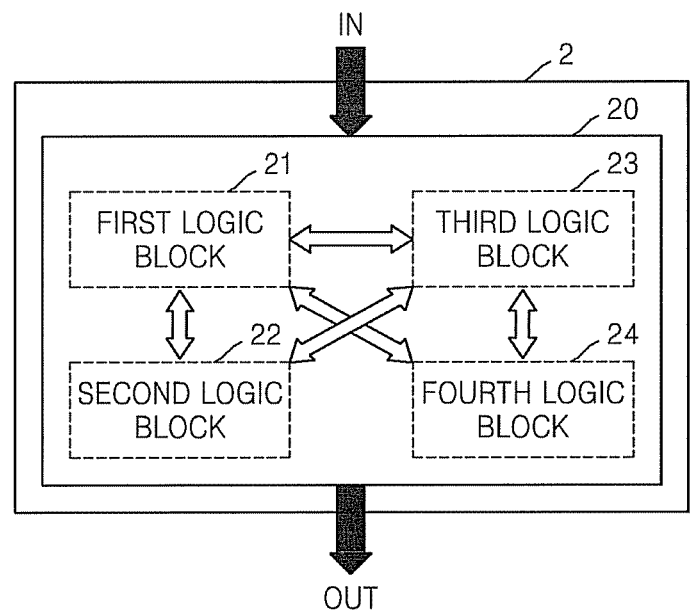
FIG. 2 is a schematic block diagram of an electronic circuit module that includes a logic device according to an example embodiment.

FIG. 2 is a schematic block diagram of an electronic circuit module 2 that includes a logic device 20 according to an example embodiment. Referring to FIG. 2, the electronic circuit module 2 may include the logic device 20 having a plurality of logic blocks 21, 22, 23, and 24. In the current example embodiment, the logic device 20 may include a plurality of nonvolatile memory devices (not shown). A plurality of nonvolatile memory devices may be disposed in regions between the plurality of logic blocks 21 to 24, in which wires cross one another. Otherwise, a plurality of nonvolatile memory devices may be disposed in regions between a plurality of functional blocks (not shown) included in the plurality of logic blocks 21 to 24, in which wires cross one another. Routing of the wires between the plurality of logic blocks 21 to 24, and routing of the wires between the plurality of functional blocks included in the plurality of logic blocks 21 to 24, may be controlled by performing a write operation, i.e., a programming operation, on the plurality of nonvolatile memory devices.

As described above, since the logic device 20 includes the plurality of nonvolatile memory devices, the electronic circuit module 2 does not need an external memory device, unlike in the existing electronic circuit modules. Thus, in order to redefine, i.e., reconfigure, an operation of the logic device 20, connection information regarding a connection among the wires between the plurality of logic blocks 21 to 24 and connection information regarding a connection among the wires between the plurality of functional blocks of the plurality of logic blocks 21 to 24, may be programmed in the plurality of nonvolatile memory devices in real time. The plurality of logic blocks 21 to 24 and the plurality of functional blocks of the plurality of logic blocks 21 to 24 may be connected to one another, based on the programmed connection information. Thus, the logic device 20 is easy to be reconfigured in real time and an external memory device is not needed, thereby reducing the size of the electronic circuit module 2.

Figure 3:
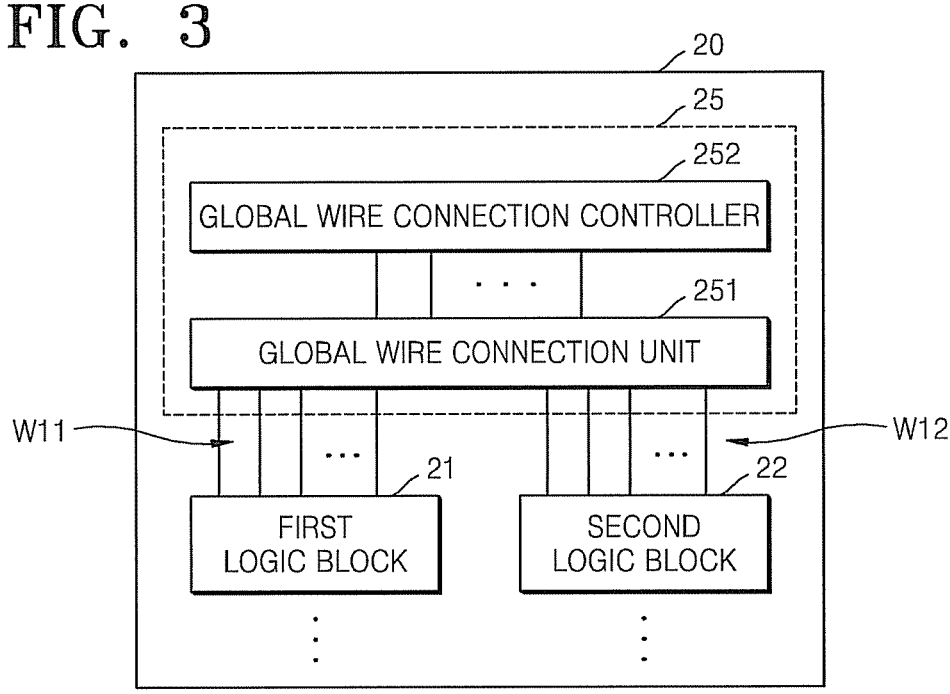
FIG. 3 is a block diagram specifically illustrating the logic device of FIG. 2.

FIG. 3 is a block diagram illustrating the logic device 20 of FIG. 2 in more detail. Referring to FIG. 3, the logic device 20 may include a global controller 25. The global controller 25 may include a global wire connection unit 251 and a global wire connection controller 252. In the current example embodiment, the logic device 20 may further include a plurality of logic blocks (not shown) being vertically located adjacent to the first and second logic blocks 21 and 22. The logic device 20 may further include a global controller that controls a connection among wires between the logic blocks adjacent to the first and second logic blocks 21 and 22. In another example embodiment, the logic device 20 may further include a plurality of logic blocks being horizontally located adjacent to the first and second logic blocks 21 and 22. The global controller 25 included in the logic device 20 may be commonly connected to the logic blocks adjacent to the first and second logic blocks 21 and 22.

Each of the first and second logic blocks 21 and 22 may include a plurality of functional blocks, and perform predetermined operations. For example, each of the first and second logic blocks 21 and 22 may include an analog-to-digital converter. The first logic block 21 may be connected to a plurality of first global wires W11, and the second logic block 21 may be connected to a plurality of second global wires W12. The plurality of first global wires W11 and the plurality of second global wires W12 may form a global wire group.

The global controller 25 may include a plurality of nonvolatile memory devices, and may control routing of the plurality of first global wires W11 and the plurality of second global wires W12, based on data stored in the plurality of nonvolatile memory devices. Operations of the global wire connection unit 251 and the global wire connection controller 252 included in the global controller 25 will now be described in detail.

The global wire connection unit 251 may include a plurality of nonvolatile memory devices disposed in regions where the plurality of first global wires W11 cross the plurality of second global wires W12, respectively. The global wire connection unit 251 may connect the plurality of first global wires W11 to the plurality of second global wires W12 based on the data stored in the plurality of nonvolatile memory devices respectively.

The global wire connection controller 252 may control the connection operation of the global wire connection unit 251 by programming the plurality of nonvolatile memory devices included in the global wire connection unit 251 in real time. If the global wire connection controller 252 is disposed above or below the global wire connection unit 251, then the global wire connection unit 251 and the global wire connection controller 252 may share a predetermined area, thereby reducing the size of the logic device 20.

Figure 4:
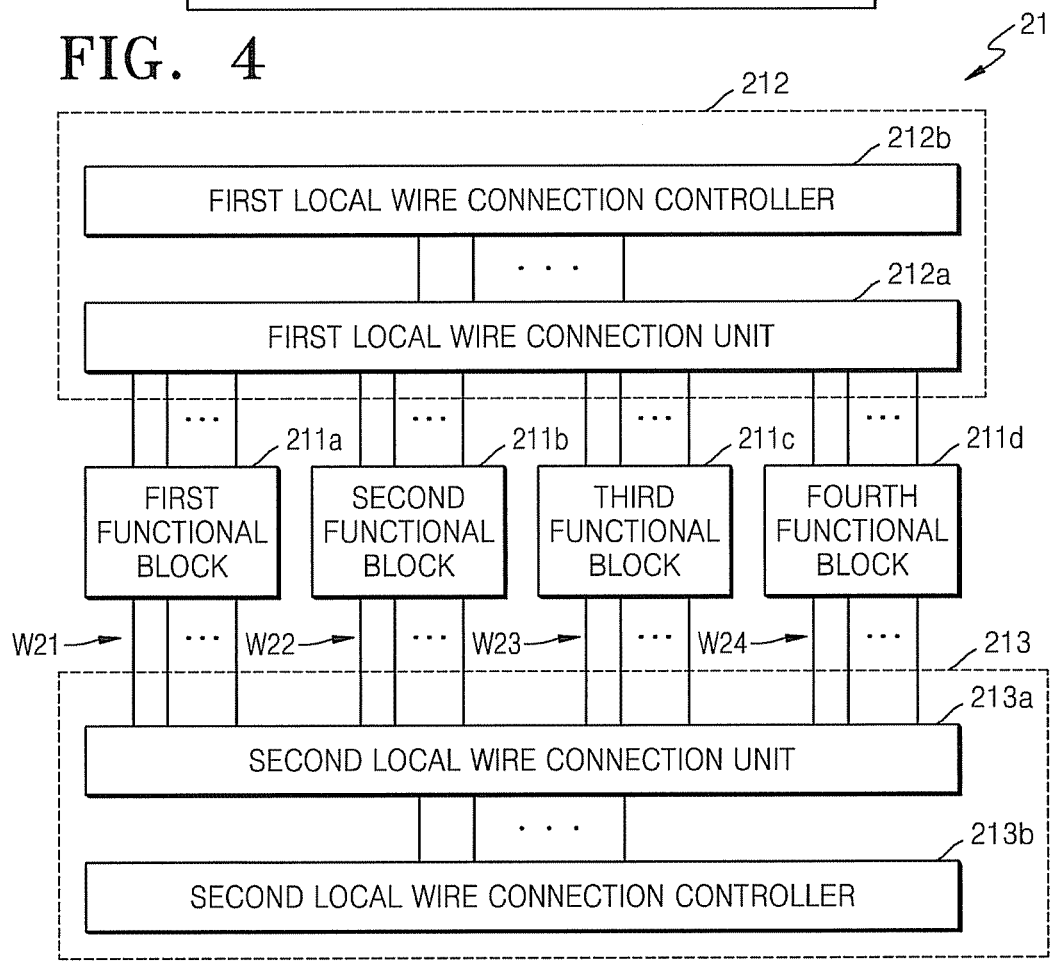
FIG. 4 is a block diagram specifically illustrating a first logic block illustrated in FIG. 3, according to an example embodiment.

FIG. 4 is a block diagram specifically illustrating the first logic block 21 illustrated in FIG. 3, according to an example embodiment. Referring to FIG. 4, the first logic block 21 may include first to fourth functional blocks 211a, 211b, 211c, and 211d, a first local controller 212, and a second local controller 213. The first local controller 212 may include a first local wire connection unit 212a and a first local wire connection controller 212b. The second local controller 213 may include a second local wire connection unit 213a and a second local wire connection controller 213b. The first logic block 21 of the current example embodiment is just an example and may be configured in one of other various ways. The configuration of the second logic block 22 of FIG. 2 may be the same as that of the first logic block 21 in the current example embodiment.

The first to fourth functional blocks 211a to 211d are functional blocks, e.g., Intellectual Property (IP) blocks or Look-Up Table (LUT) blocks, which may be programmed by a user to be reused. The first functional block 211a may be connected to a plurality of first local wires W21, the second functional block 211b may be connected to a plurality of second local wires W22, the third functional block 211c may be connected to a plurality of third local wires W23, and the functional block 211d may be connected to a plurality of fourth local wires W24. The first to fourth local wires W21 to W24 may form a local wire group.

Specifically, each of the first to fourth functional blocks 211a to 211d may include a plurality of logic gates. An operation of the first logic block 21 may be reconfigured by reconfiguring an operation of each of the first to fourth functional blocks 211a to 211d by changing a connection among the plurality of logic gates. Also, if one of the first to fourth functional blocks 211a to 211d is an LUT block, the operation of the first logic block 21 may be reconfigured by changing an LUT value thereof.

The first and second local controllers 212 and 213 may include a plurality of nonvolatile memory devices, and control routing of the plurality of first to fourth local wires W21 to W24, based on data stored in the plurality of nonvolatile memory devices. Operations of the first and second local wire connection units 212a and 213a and the first and second local wire connection controllers 212b and 213b will now be described in detail.

Each of the first and second local wire connection units 212a and 213a may include a plurality of nonvolatile memory devices disposed in regions where the plurality of first to fourth local wires W21 to W24 cross one another, and may connect the plurality of first to fourth local wires W21 to W24, based on the data stored in the plurality of nonvolatile memory devices.

The first local wire connection controller 212b may control the connection operation of the first local wire connection unit 212a by programming the plurality of nonvolatile memory devices included in the first local wire connection unit 212a, in real time. The second local wire connection controller 213b may control the connection operation of second local wire connection unit 213a by programming the plurality of nonvolatile memory devices included in the second local wire connection unit 213a, in real time.

Figure 5A:
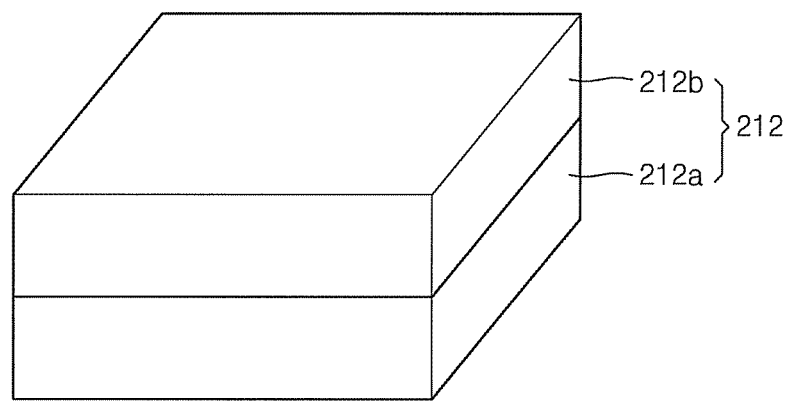
FIG. 5A illustrates the first local controller 212 illustrated in FIG. 4, according to an example embodiment.

FIG. 5A illustrates the first local controller 212 illustrated in FIG. 4, according to an example embodiment.

Referring to FIG. 5A, the first local wire connection controller 212b may be disposed above the first local wire connection unit 212a, such that the first local wire connection unit 212a and the first local wire connection controller 212b may share an area. Similarly, the second local wire connection controller 213b may be disposed above the second local wire connection unit 213a, such that the second local wire connection unit 213a and the second local wire connection controller 213b may share an area. Accordingly, the size of the logic device 20 may be reduced.

Figure 5B:
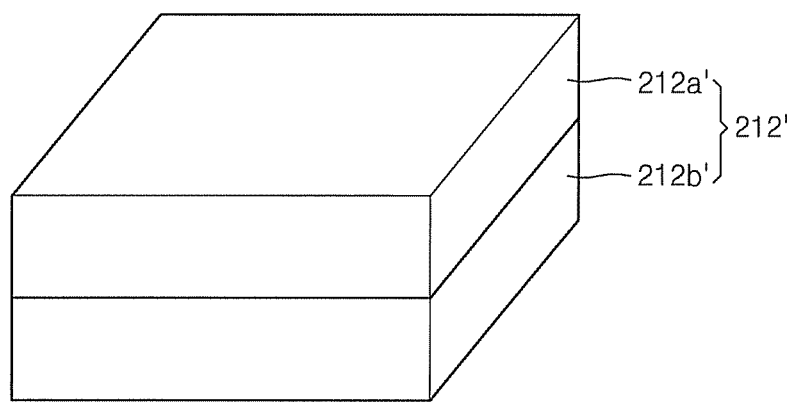
FIG. 5B illustrates the first local controller 212' illustrated in FIG. 4, according to another example embodiment.

FIG. 5B illustrates the first local controller 212' illustrated in FIG. 4, according to another example embodiment.

Referring to FIG. 5B, the first local wire connection controller 212b' may be disposed below the first local wire connection unit 212a', such that the first local wire connection unit 212a' and the first local wire connection controller 212b' may share an area. Similarly, the second local wire connection controller 213b may be disposed below the second local wire connection unit 213a, such that the second local wire connection unit 213a and the second local wire connection controller 213b may share an area. Accordingly, the size of the logic device 20 may be reduced.

Figure 6:
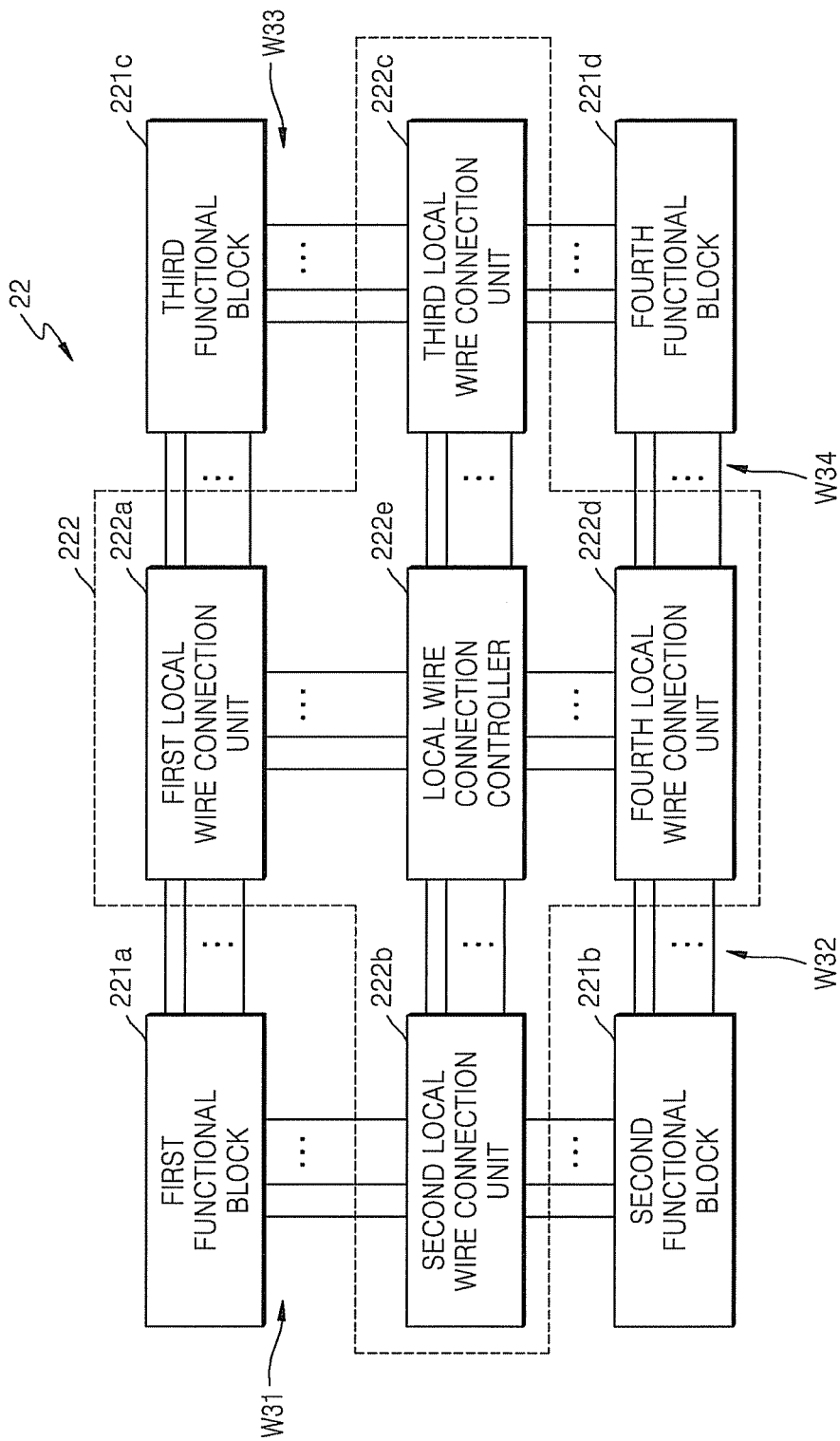
FIG. 6 is a block diagram specifically illustrating a second logic block illustrated in FIG. 3, according to an example embodiment.

FIG. 6 is a block diagram specifically illustrating the second logic block 22 illustrated in FIG. 3, according to an example embodiment. Referring to FIG. 6, the second logic block 22 may include first to fourth functional blocks 221a, 221b, 221c, and 221d, and a local controller 222. The local controller 222 may include first to fourth local wire connection units 222a, 222b, 222c, and 222d, and a local wire connection controller 222e. The second logic block 22 of the current example embodiment is just an example and may be configured in one of various other ways. The configuration of the first logic block 21 of FIG. 2 may be the same as that of the second logic block 22.

The first to fourth functional blocks 221a to 221d are functional blocks, e.g., IP blocks or LUT blocks, which may be programmed by a user to be reused. The first functional block 221a may be connected to a plurality of first local wires W31, a second functional block 221b may be connected to a plurality of second local wires W32, a third functional block 221c may be connected to a plurality of third local wires W33, and a fourth functional block 221d may be connected to a plurality of fourth local wires W34. The first to fourth local wires W31, W32, W33, and W34 may form a local wire group.

Specifically, the first to fourth functional blocks 221a to 221d may include a plurality of logic gates, respectively. An operation of the second logic block 22 may be reconfigured by reconfiguring operations of the first to fourth functional blocks 221a to 221d by changing a connection among the plurality of logic gates. If one of the first to fourth functional blocks 221a to 221d is an LUT block, the operation of the second logic block 22 may be reconfigured by changing an LUT value thereof.

The local controller 222 may include a plurality of nonvolatile memory devices, and may control routing of the plurality of first to fourth local wires W31 to W34, based on data stored in the plurality of nonvolatile memory devices. Operations of the first to fourth local wire connection units 222a to 222d and the local wire connection controller 222e will now be described in detail.

The first to fourth local wire connection units 222a to 222d may include a plurality of nonvolatile memory devices in regions where the plurality of first to fourth local wires W31 to W34 cross one another, and may connect the plurality of first to fourth local wires W31 to W34 to one another, based on data stored in the plurality of nonvolatile memory devices.

Specifically, the first local wire connection unit 222a may include a plurality of nonvolatile memory devices disposed in regions where the plurality of first local wires W31 cross the plurality of third local wires W33, respectively, and may connect the plurality of first local wires W31 to the plurality of third local wires W33, respectively, based on data stored in the plurality of nonvolatile memory devices. The second local wire connection unit 222b may include a plurality of nonvolatile memory devices disposed in regions where the plurality of first local wires W31 cross the plurality of second local wires W32, respectively, and may connect the plurality of first local wires W31 to the plurality of second local wires W32, respectively, based on data stored in the plurality of nonvolatile memory devices.

The third local wire connection unit 222c may include a plurality of nonvolatile memory devices disposed in regions where the plurality of third local wires W33 cross the plurality of fourth local wires W34, respectively, and may connect the plurality of third local wires W33 to the plurality of fourth local wires W34, respectively, based on data stored in the plurality of nonvolatile memory devices. The fourth local wire connection unit 222d may include a plurality of nonvolatile memory device disposed in regions where the plurality of second local wires W32 cross the plurality of fourth local wires W34, respectively, and may connect the plurality of second local wires W32 to the plurality of fourth local wires W34, respectively, based on data stored in the plurality of nonvolatile memory devices.

The local wire connection controller 222e may control the connection operations of the first to fourth local wire connection units 222a to 222d by programming the plurality of nonvolatile memory devices included in the first to fourth local wire connection units 222a to 222d, in real time. In this case, if the local wire connection controller 222e is disposed above or below the first to fourth local wire connection units 222a to 222d, then the first to fourth local wire connection units 222a to 222d and the local wire connection controller 222e may share an area, thereby reducing the size of the logic device 20.

Figure 7:
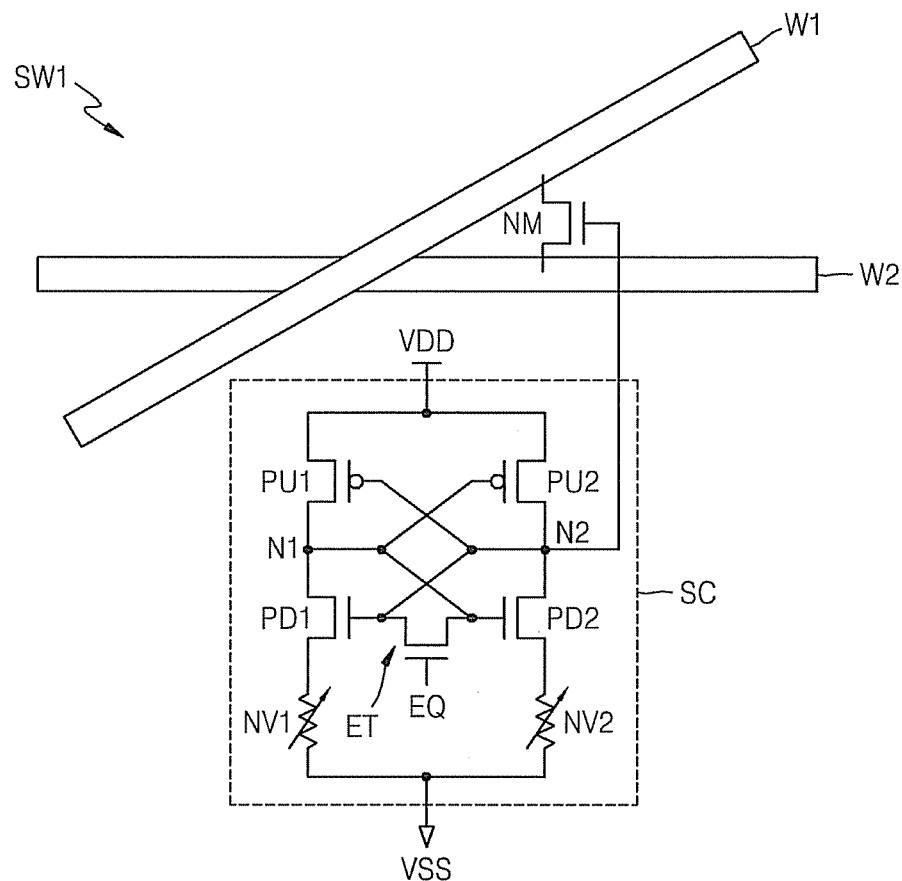
FIG. 7 is a circuit diagram illustrating a first routing method performed between wires included in the logic device of FIG. 2, according to an example embodiment.

FIG. 7 is a circuit diagram illustrating a first routing method performed between wires included in the logic device 20 of FIG. 2, according to an example embodiment. Referring to FIG. 7, if a first wire W1 and second wire W2 included in the logic device 20 are connected to each other according to the first routing method, a first switching unit SW1 may be disposed at a region where the first wire W1 and the second wire W2 cross each other. In an example embodiment, as illustrated in FIG. 3, the first wire W1 may one of wires, i.e., the first global wires W11, which are connected to the first logic block 21, and the second wire W2 may be one of wires, i.e., the second global wires W12, which are connected to the second logic block 22. In another example embodiment, as illustrated in FIG. 4, the first wire W1 may be one of wires, i.e., the first local wires W21, which are connected to first functional block 211a, and the second wire W2 may be one of wires, i.e., the second local wires W22, which are connected to the second functional block 211b. In another example embodiment, as illustrated in FIG. 6, the first wire W1 may be one of wires, i.e., the first local wires W31, which are connected to the first functional block 221a, and the second wire W2 may be one of wires, i.e., the second local wires W32, which are connected to the second functional block 221b.

The first switching unit SW1 may include a switch NM and a switch controller SC. In the current example embodiment, the switch NM may be embodied as an NMOS transistor. In this case, a source and drain of the switch NM may be connected to the first wire W1 and the second wire W2, respectively, but example embodiments are not limited thereto and the switch NM may be configured in one of other various ways.

The switch controller SC may be connected to the switch NM to control switching on or off of the switch NM. In detail, the switch controller SC may include at least one nonvolatile memory device that is programmed by, for example, the global wire connection controller 252 or the local wire connection controller 212b, 213b, or 222e, and may control switching on or off of the switch NM, based on a result of programming the at least one nonvolatile memory device. In the current example embodiment, the switch controller SC may include first and second pull-up devices PU1 and PU2, first and second pull-down devices PD1 and PD2, an equalizer ET, and first and second nonvolatile memory devices NV1 and NV2.

The first pull-up device PU1 may be embodied as a PMOS transistor having a source connected to a power supply voltage terminal VDD, a drain connected to a first node N1, and a gate connected to a second node N2. The first pull-down device PD1 may be embodied as an NMOS transistor having a drain connected to the first node N1 and a gate connected to the second node N2. The first pull-up device PU1 and the first pull-down device PD1 may form a first inverter.

The second pull-up device PU2 may be embodied as a PMOS transistor having a source connected to the power supply voltage terminal VDD, a drain connected to the second node N2, and a gate connected to the first node N1. The second pull-down device PD2 may be embodied as an NMOS transistor having a drain connected to the second node N2 and a gate connected to the first node N1. The second pull-up device PU2 and the second pull-down device PD2 may form a second inverter. As described above, the first inverter and the second inverter may be cross-coupled to form a latch.

The equalizer ET is connected between the gate of the first pull-down device PD1 and the gate of the second pull-down device PD2, and connects the gate of the first pull-down device PD1 to the gate of the second pull-down device PD2 when an equalization signal EQ is activated. For example, the equalizer ET may be embodied as an NMOS transistor having a source connected to the gate of the first pull-down device PD1, a drain connected to the gate of the second pull-down device PD2, and a gate to which the equalization signal EQ is supplied. If the equalization signal EQ is activated to '1', then the equalizer ET is turned on to connect the gate of the first pull-down device PD1 to the gate of the second pull-down device PD2. Thus, a voltage of the gate of the first pull-down device PD1 becomes equal to that of the gate of the second pull-down device PD2.

The first nonvolatile memory device NV1 is connected between the source of the first pull-down device PD1 and a ground voltage terminal VSS, and the second nonvolatile memory device NV2 is connected between the source of the second pull-down device PD2 and the ground voltage terminal VSS. In this case, the first nonvolatile memory device NV1 and the second nonvolatile memory device NV2 may be programmed in a complementary manner.

In the current example embodiment, the first and second nonvolatile memory devices NV1 and NV2 may be resistive memory devices, magnetic memory devices, or flash memory devices. An operation of the first switching unit SW1 according to a result of programming the first and second nonvolatile memory devices NV1 and NV2 when the first and second nonvolatile memory devices NV1 and NV2 are resistive memory device, will now be described in detail. However, the first and second nonvolatile memory devices NV1 and NV2 are not limited to resistive memory devices as described above.

First, if the first and second nonvolatile memory devices NV1 and NV2 are programmed to '1' and '0', respectively, then the first nonvolatile memory device NV1 is in a low resistance state and the second nonvolatile memory device NV2 is in a high resistance state. In this case, if the equalization signal EQ is '1', then the equalizer ET is turned on and the first nonvolatile memory device NV1 has a low resistance from among the first and second nonvolatile memory devices NV1 and NV2 connected to the same ground voltage terminal VSS. Thus, the first node N1 is connected to the ground voltage terminal VSS. Accordingly, a voltage of the first node N1 is '0', a voltage of the second node N2 is '1', and thus, the switch NM is turned on to connect the first wire W1 to the second wire W2.

If the first nonvolatile memory device NV1 and the second nonvolatile memory device NV2 are programmed to '0' and '1', respectively, then the first nonvolatile memory device NV1 is in the high resistance state and the second nonvolatile memory device NV2 is in the low resistance state. In this case, if the equalization signal EQ is '1', then the equalizer ET is turned on and the second nonvolatile memory device NV2 has a lower resistance from among the first and second nonvolatile memory devices NV1 and NV2 connected to the same ground voltage terminal VSS. Thus, the second node N2 is connected to the ground voltage terminal VSS. Thus, since the voltage of the second node N2 is '0', the switch NM is turned off, and the first wire W1 and the second wire W2 are not connected to each other.

In this case, a time needed to perform a write operation on each of the first and second nonvolatile memory devices NV1 and NV2 may be about 20 ns, and a time needed to perform a read operation on each of the first and second nonvolatile memory devices NV1 and NV2 may be about 10 ns. Also, a ratio of an 'on' resistance to an 'off' resistance (hereinafter, referred to as an "on/off ratio") of each of the first and second nonvolatile memory devices NV1 and NV2 may be about 3.

In the current example embodiment, in the first switching unit SW1, the switch NM and the switch controller SC are disposed in a region where the first wire W1 and the second wire W2 cross each other, and the first and second nonvolatile memory devices NV1 and NV2 included in the switch controller SC are programmed in a complementary manner, thereby controlling a connection between the first wire W1 and the second wire W2. In this case, when the first and second nonvolatile memory devices NV1 and NV2 are programmed in such a manner that the first wire W1 and the second wire W2 are not connected to each other, the switch NM is turned off, thereby preventing leakage current from flowing between the first wire W1 and the second wire W2.

In another example embodiment, the switch controller Sc may include one nonvolatile memory device and one resistor instead of the first and second nonvolatile memory devices NV1 and NV2. In this case, the resistor, a resistance of which is equal to a median value between a resistance of the nonvolatile memory device in a high resistance state and a resistance of the nonvolatile memory device in a low resistance state, may be selected. Specifically, a connection between the first wire W1 and the second wire W2 may be controlled by comparing the resistance of the nonvolatile memory device when the nonvolatile memory device is programmed with the resistance of the resistor.

More specifically, if the nonvolatile memory device is programmed to '1', then the nonvolatile memory device may be in a low resistance state and thus may have a resistance lower than the resistance of the resistor. Thus, the voltage of the first node N1 may be '0', the voltage of the second node N2 may be '1', and the switch NM may be turned on to connect the first wire W1 and the second wire W2 to each other. If the nonvolatile memory device is programmed to '0', then the nonvolatile memory device may be in the high resistance state and thus may have a resistance higher than the resistance of the resistor. Accordingly, the voltage of the second node N2 may be '0', the switch NM may be turned off, and thus, the first wire W1 and the second wire W2 may not be connected to each other.

As described above, if the first wire W1 and the second wire W2 are connected according to the first routing method, the switch NM is turned off, thereby preventing leakage current from flowing between the first wire W1 and the second wire W2. However, the switching controller SC is required, thus increasing the whole area of the first switch unit SW1. Accordingly, in the logic device 20, it may be more efficient to use the first routing method when the global wire connection unit 251 is used than when the local wire connection units 212b, 213b, and 222e are used.

The global wires W11 and W21 included in the logic device 20 may be thicker and longer than the local wires W21 to W24 and W31 to W34. Thus, since the global wires W11 and W12 may have a high capacitance, the high capacitances of the global wires W11 and W12 may increase when leakage current flows between the global wires W11 and W12. Accordingly, it is efficient to perform routing between the global wires W11 and W12 according to the first routing method.

Figure 8:
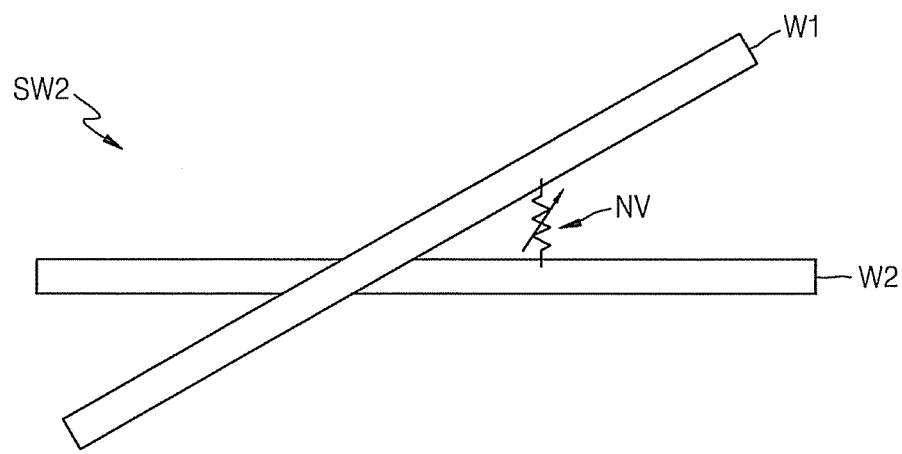
FIG. 8 is a circuit diagram illustrating a second routing method performed between wires included in the logic device of FIG. 2, according to an example embodiment.

FIG. 8 is a circuit diagram illustrating a second routing method performed between wires included in the logic device 20 of FIG. 2, according to an example embodiment. Referring to FIG. 8, when the first wire W1 and the second wire W2 included in the logic device 20 are connected according to the second routing method, a second switching unit SW2 may be disposed in a region where the first wire W1 and the second wire W2 cross each other. In an example embodiment, the first wire W1 may be one of wires, i.e., the first global wires W11, which are connected to the first logic block 21, and the second wire W2 may be one of wires, i.e., the second global wires W12, which are connected to the second logic block 22. In another example embodiment, the first wire W1 may be one of wires, i.e., the first local wires W21, which are connected to the first functional block 211a, and the second wire W2 may be one of wires, i.e., the second local wires W22, which are connected to the second functional block 211b. In another example embodiment, the first wire W1 may be one of wires, i.e., the first local wires W31, which are connected to the first functional block 221a, and the second wire W2 may be one of wires, i.e., the second local wires W32, which are connected to the second functional block 221b.

The second switching unit SW2 may include a nonvolatile memory device NV. For example, the nonvolatile memory device NV may be a resistive memory device or a flash memory device. A case where the nonvolatile memory device NV is a resistant memory device will now be described in detail but the nonvolatile memory device NV is not limited thereto.

First, if the nonvolatile memory device NV is programmed to '1', then the nonvolatile memory device NV is in a low resistance state and the second switching unit SW2 is turned on. Thus, since current is likely to flow between the first wire W1 and the second wire W2, the first wire W1 and the second wire W2 may be connected to each other. If the nonvolatile memory device NV is programmed to '0', then the nonvolatile memory device NV is in a high resistance state and the second switching unit SW2 is turned off. Thus, since current is difficult to flow between the first wire W1 and the second wire W2, the first wire W1 and the second wire W2 are not connected to each other.

In the current example embodiment, since the second switching unit SW2 does not include any transistor and is turned on by using the nonvolatile memory device NV, leakage current may flow through the second switching unit SW2 even when the second switching unit SW2 is turned off. Thus, the nonvolatile memory device NV may be formed of a material having an appropriate high resistance in a high resistance state. For example, an 'off' resistance of the nonvolatile memory device NV may be about 1 MΩ or more, and an on/off ratio thereof may be about 1000. In this case, a time needed to perform a write operation on the nonvolatile memory device NV may be about 20 ns, and a time needed to perform a read operation on the nonvolatile memory device NV may be about 10 ns.

Accordingly, in order to easily control a connection between the first wire W1 and the second wire W2, the nonvolatile memory device NV may be formed of a material that increases the difference between the resistance of the nonvolatile memory device NV when the nonvolatile memory device NV is programmed to '1', i.e., in the low resistance state, and the resistance of the nonvolatile memory device NV when the nonvolatile memory device NV is programmed to '0', i.e., in the high resistance state.

As described above, when the first wire W1 and the second wire W2 are connected according to the second routing method, it is possible to control a connection between the first wire W1 and the second wire W2 by disposing only the nonvolatile memory device NV between the first wire W1 and the second wire W2. Thus, it is very simple to manufacture the second switch unit SW2 while reducing the area of the second switch unit SW2, thereby increasing efficiency. Accordingly, in the logic device 20, it may be efficient to use the second routing method when the local wire connection units 212b, 213b, and 222e are used than when the global wire connection unit 251 is used.

Figure 9:
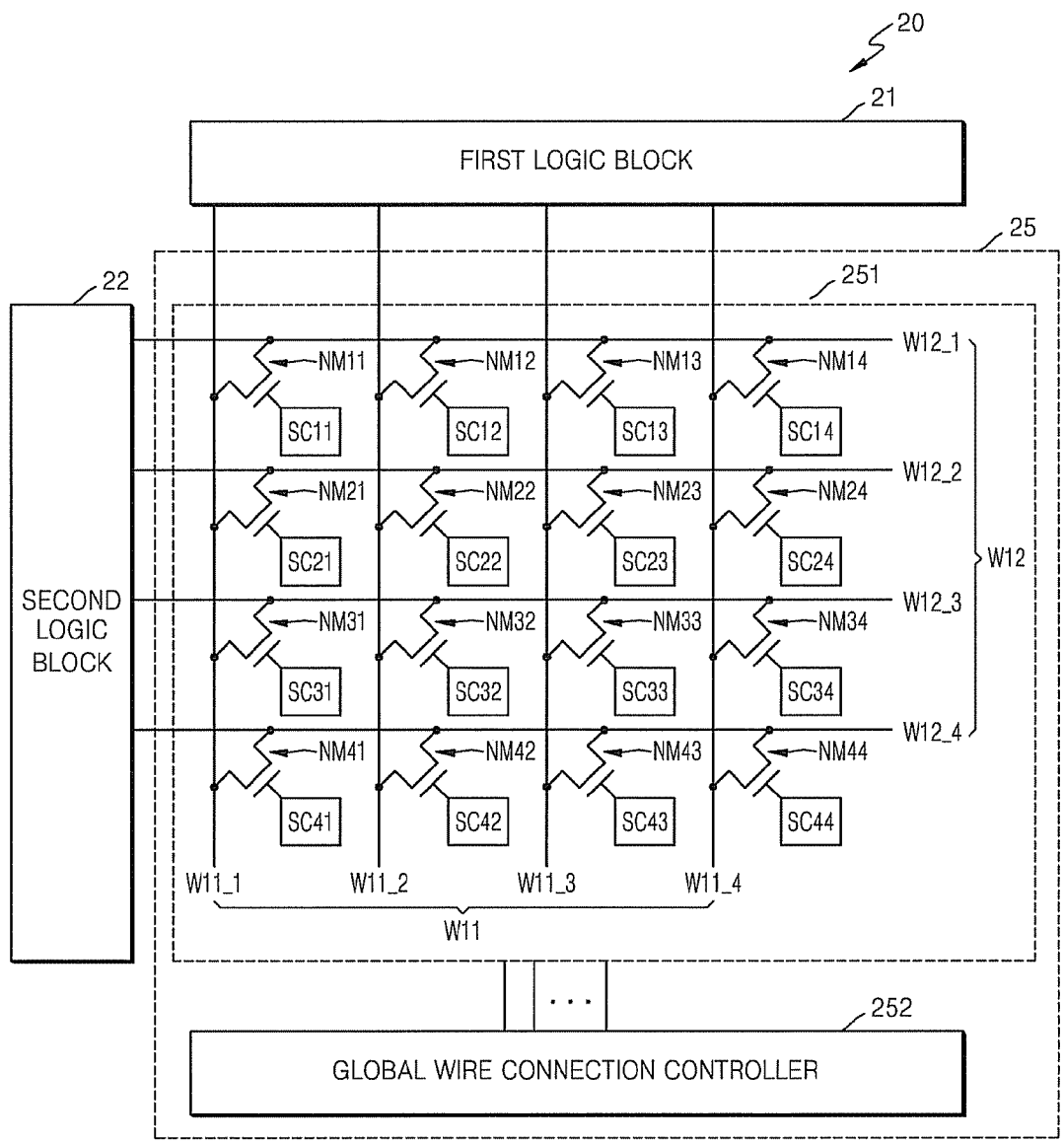
FIG. 9 is a circuit diagram more specifically illustrating the logic device of FIG. 3.

FIG. 9 is a circuit diagram more specifically illustrating the logic device 20 of FIG. 3. Referring to FIG. 9, the logic device 20 may include the first logic block 21, the second logic block 22, and the global controller 25. The global controller 25 may include the global wire connection unit 251 and the global wire connection controller 252. The configuration of the global wire connection unit 251 in the logic device 20 is more specifically illustrated in FIG. 9 than in FIG. 2.

In the current example embodiment, the global wire connection unit 251 may connect first global wires W11 to second global wires W12 according to the first routing method described above with reference to FIG. 7. Thus, the global wire connection unit 251 may include a plurality of switching units disposed in regions where the first global wires W11 cross second global wires W12, respectively. Each of the plurality of switching units may include a switch and a switch controller.

In detail, a first switch NM11 and a first switch controller SC11 may be disposed in a region where a first global wire W11_1 disposed nearest to the second logic block 22 from among the first global wires W11 crosses a second global wire W12_1 disposed nearest to the first logic block 21 from among the second global wires W12. Also, a second switch NM21 and a second switch controller SC21 may be disposed in a region where the first global wire W11_1 crosses a second global wire W12_2 disposed secondly nearest to the first logic block 21 from among the second global wires W12.

The global wire connection controller 252 may be connected to switch controllers SC11 to SC44 included in the global wire connection unit 251, and may program a plurality of nonvolatile memory devices included in the switch controllers SC11 to SC44. Thus, the global wire connection controller 252 may control a connection operation of the global wire connection unit 251.

In the current example embodiment, the global wire connection controller 252 may share the sixteen switch controllers SC11 to SC44. Since each of the sixteen switch controllers SC11 to SC44 includes at least one nonvolatile memory device, the more switch controllers that the global wire connection controller 252 shares, the longer time the global wire connection controller 252 needs to program all the nonvolatile memory devices.

Figure 10:
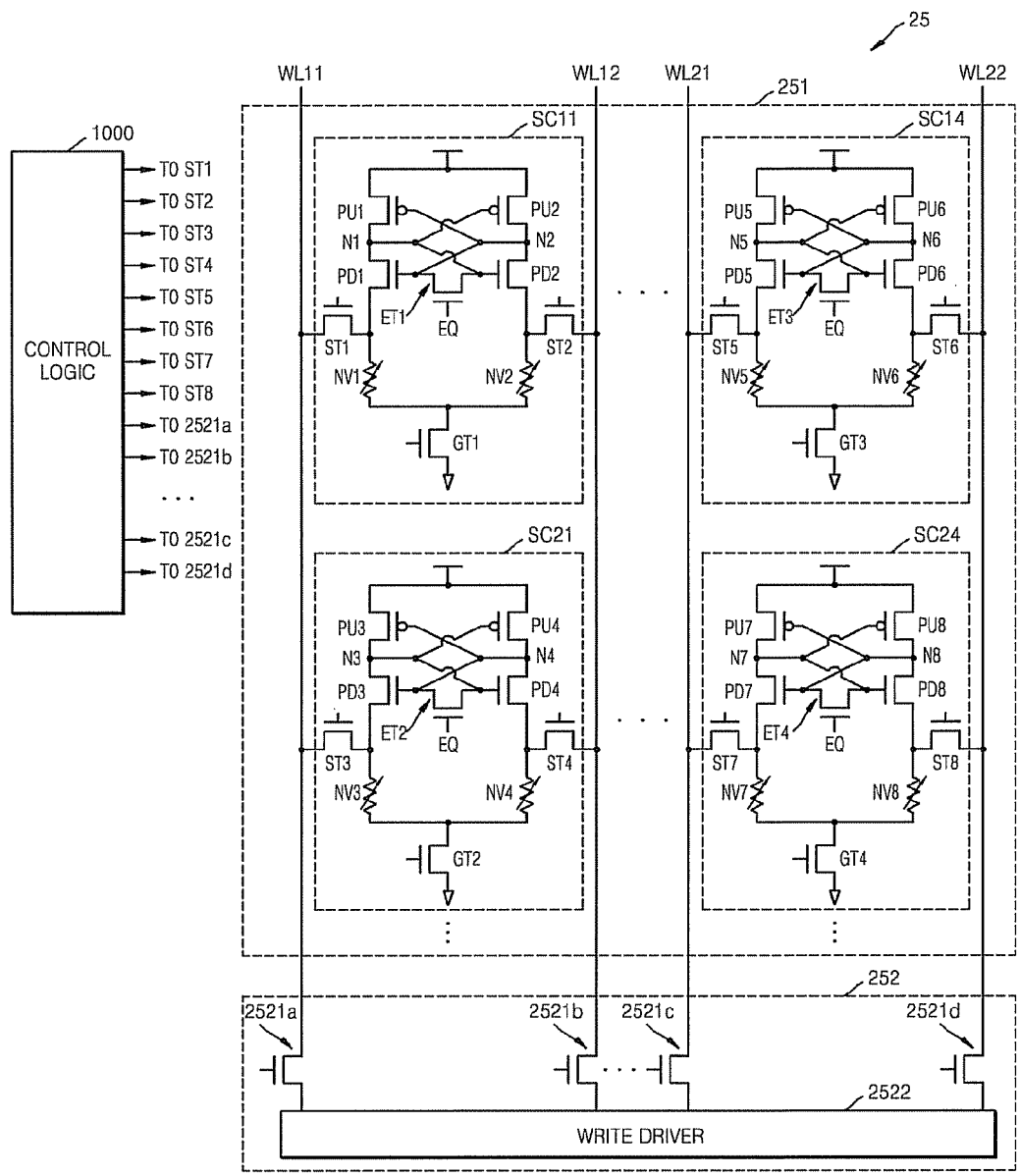
FIG. 10 is a circuit diagram specifically illustrating a global controller illustrated in FIG. 9, according to an example embodiment.

FIG. 10 is a circuit diagram specifically illustrating the global controller 25 illustrated in FIG. 9 and a control logic 1000, according to an example embodiment. Referring to FIG. 10, the global controller 25 may include the global wire connection unit 251 and the global wire connection controller 252. As described above, the global wire connection controller 252 are connected to the plurality of switch controllers included in the global wire connection unit 251, and program at least one nonvolatile memory device included in the plurality of switch controller. In FIG. 10, a plurality of switches included in the global wire connection unit 251 are not illustrated so as to specifically describe a relationship among the plurality of switch controllers included in the global wire connection unit 251 and the global wire connection controller 252.

The global wire connection unit 251 may include the first to fourth switch controllers SC11, SC21, SC14, and SC24, and each of the first to fourth switch controllers SC11, SC21, SC14, and SC24 may be connected to the global wire connection controller 252 via a pair of write lines. In the current example embodiment, from among the first to fourth switch controllers SC11, SC21, SC14, and SC24, the first and second switch controllers SC11 and SC21 that are vertically adjacent to each other may share a pair of write lines WL11 and WL12, and the third and fourth switch controllers SC14 and SC24 that are vertically adjacent to each other may share a pair of write lines WL21 and WL22.

The first switch controller SC11 may include first and second pull-up devices PU1 and PU2, first and second pull-down devices PD1 and PD2, an equalizer ET1, first and second nonvolatile memory devices NV1 and NV2, a ground transistor GT1, and first and second switch transistors ST1 and ST2. The first and second switch transistors ST1 and ST2 may receive pieces of complementary data via the pair of write lines WL11 and WL12, respectively. Thus, the pieces of complementary data may be written to the first and second nonvolatile memory devices NV1 and NV2, respectively. In this case, a second node N2 between the second pull-up device PU2 and the second pull-down device PD2 may be connected to the switch NM11, and switching on or off of the switch NM11 may be controlled according to a voltage of the second node N2.

The second switch controller SC21 may include first and second pull-up devices PU3 and PU4, first and second pull-down devices PD3 and PD4, an equalizer ET2, first and second nonvolatile memory devices NV3 and NV4, a ground transistor GT2, and first and second switch transistors ST3 and ST4. The first and second switch transistors ST3 and ST4 may receive pieces of complementary data via a pair of write lines WL11 and WL12, respectively. Thus, the pieces of complementary data may be written to the first and second nonvolatile memory devices NV3 and NV4, respectively. In this case, a second node N4 between the second pull-up device PU4 and the second pull-down device PD4 may be connected to the switch NM21, and switching on or off of the switch NM21 may be controlled according to a voltage of the second node N4.

The third switch controller SC14 may include first and second pull-up devices PU5 and PU6, first and second pull-down devices PD5 and PD6, an equalizer ET3, first and second nonvolatile memory devices NV5 and NV6, a ground transistor GT3, and first and second switch transistors ST5 and ST6. The first and second switch transistors ST5 and ST6 may receive pieces of complementary data via the pair of write lines WL21 and WL22, respectively. Thus, the pieces of complementary data may be written to the first and second nonvolatile memory devices NV5 and NV6, respectively. In this case, a second node N6 between the second pull-up device PU6 and the second pull-down device PD6 may be connected to a switch NM14, and switching on or off of the switch NM14 may be controlled according to voltage of the second node N6.

The fourth switch controller SC24 may include first and second pull-up devices PU7 and PU8, first and second pull-down devices PD7 and PD8, an equalizer ET4, first and second nonvolatile memory devices NV7 and NV8, a ground transistor GT4, and first and second switch transistors ST5 and ST6. The first and second switch transistors ST7 and ST8 may receive pieces of complementary data via the pair of write lines WL21 and WL22, respectively. Thus, the pieces of complementary data may be written to the first and second nonvolatile memory devices NV7 and NV8, respectively. In this case, a second node N8 between the second pull-up device PU8 and the second pull-down device PD8 may be connected to a switch NM24, and switching on or off of the switch NM24 may be controlled according to a voltage of the second node N8.

The global wire connection controller 252 may include first to fourth write decoders 2521a, 2521b, 2521c, and 2521d, and a write driver 2522. The first to fourth write decoders 2521a, 2521b, 2521c, and 2521d may be commonly connected to the write driver 2522. In the current example embodiment, the first to fourth write decoders 2521a, 2521b, 2521c, and 2521d may be embodied as NMOS transistors that are turned on or off according to a control signal.

The first and second write decoders 2521a and 2521b may be connected to a pair of write lines, i.e., the first write line WL11 and the first complementary write line WL12, respectively. For example, the first and second write decoders 2521a and 2521b may be commonly connected to the four switch controllers SC11, SC21, SC31, and SC41 via the first write line WL11 and the first complementary write line WL12, respectively.

The third and fourth write decoders 2521c and 2521d may be connected to a pair of write lines, i.e., the second write line WL21 and the second complementary write line WL22, respectively. For example, the third and fourth write decoders 2521c and 2521d may be commonly connected to the four switch controllers SC14, SC24, SC34, and SC44 via the second write line WL21 and the second complementary write line WL22, respectively.

The write driver 2522 may provide write data to the first to fourth write decoders 2521a, 2521b, 2521c, and 2521d. The write driver 2522 may share the first to fourth write decoders 2521a, 2521b, 2521c, and 2521d, and thus may share, for example, the sixteen switch controllers SC11 to SC44. Each of the switch controllers SC11 to SC44 includes at least one nonvolatile memory device. Thus, the more switch controllers that the write driver 2522 shares, the longer time the write driver 2522 needs to program all the nonvolatile memory devices.

Operations of the global wire connection unit 251 and the global wire connection controller 252 will now be described in detail. The write driver 2522 may provide write data to the first to fourth write decoders 2521a, 2521b, 2521c, and 2521d. The first to fourth write decoders 2521a, 2521b, 2521c, and 2521d may be turned on or off according to a control signal to provide write data to the switch controllers SC11, SC21, SC14, and SC24, respectively, and signals output from the control logic 1000 to the first to fourth write decoders 2521a, 2521b, 2521c, and 2521d, respectively. The control logic 1000 is also configured to output signal to gates of the switch transistors ST1-ST8, respectively.

For example, the write driver 2522 may provide '1' to the first write decoder 2521a, and provide '0' to the second write decoder 2521d. In this case, the first write decoder 2521a may provide '1' to the first switch transistor ST1 included in the first second switch controller SC11 and the first switch transistor ST3 included in the second switch controller SC21, and the second write decoder 2521b may provide '0' to the second switch transistor ST2 included in the first switch controller SC11 and the second switch transistors ST4 included in the second switch controller SC21. Thus, '1' may be written to the first nonvolatile memory device NV1 included in the first switch controller SC11 and the first nonvolatile memory device NV3 included in the second switch controller SC21, and '0' may be written to the second nonvolatile memory device NV2 included in the first switch controller SC11 and the second nonvolatile memory device NV4 included in the second switch controller SC21. Thus, the switches NM11 and NM21 connected to the first and second switch controllers SC11 and SC21, respectively, may be turned on.

Also, the write driver 2522 may provide '1' to the third write decoder 2521c and provide '0' to the fourth write decoder 2521d. In this case, the third write decoder 2521c may provide '1' to the first switch transistor ST5 included in the third switch controller SC14 and the first switch transistor ST7 included in the fourth switch controller SC24, and the fourth write decoder 2521d may provide '0' to the second switch transistor ST6 included in the third switch controller SC14 and the second switch transistor ST8 included in the fourth switch controller SC24. Thus, '1' may be written to the first nonvolatile memory device NV5 included in the third switch controller SC14 and the first nonvolatile memory device NV7 included in the fourth switch controller SC24, and '0' may be written to the second nonvolatile memory device NV6 included in the third switch controller SC14 and the second nonvolatile memory device NV8 included in the fourth switch controller SC24. Accordingly, the switches NM14 and NM24 connected to the third and fourth switch controllers SC14 and SC24, respectively, may be turned on.

Figure 11:
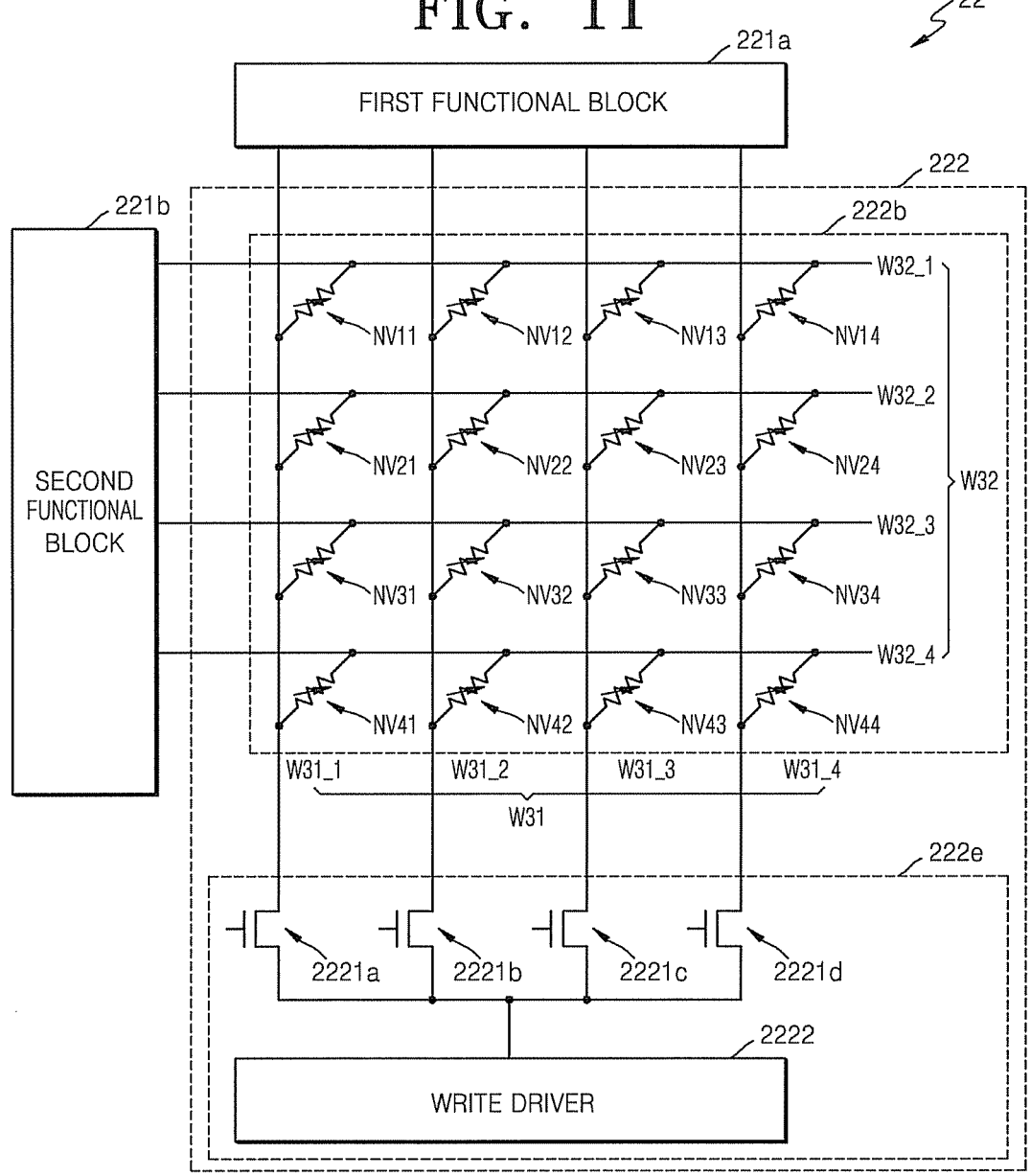
FIG. 11 is a block diagram more specifically illustrating the second logic block illustrated in FIG. 3.
Figure 11:
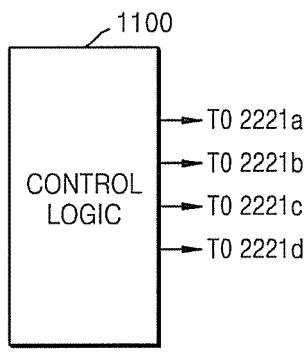

FIG. 11 is a block diagram more specifically illustrating the second logic block 22 illustrated in FIG. 6 and a control logic 1100. Referring to FIG. 11, the second logic block 22 may include the first and second functional blocks 221a and 221b, and the local controller 222. The local controller 222 may include the second local wire connection unit 222b and the local wire connection controller 222e. The configuration of the second local wire connection unit 222b in the second logic block 22 is more specifically illustrated in FIG. 11 than in FIG. 6. Although not shown in FIG. 11, the configurations of the first, third and fourth local wire connection units 222a, 222c, and 222d illustrated in FIG. 6 may be similar to that of the second local wire connection unit 222b. Also, the configurations of the first and second local wire connection units 212a and 213a illustrated in FIG. 4 may be similar to that of the second local wire connection unit 222b.

In the current example embodiment, the second local wire connection unit 222b may connect the first local wires W31 to the second local wires W32 according to the second routing method described above with reference to FIG. 8. Thus, the second local wire connection unit 222b may include a plurality of nonvolatile memory devices disposed in regions where the first local wires W31 cross the second local wires W32, respectively.

In detail, a first nonvolatile memory device NV11 may be disposed in a region where a first local wire W31_1 disposed nearest to the second functional block 221b from among the first local wires W31 crosses a second local wire W32_1 disposed nearest to the first functional block 221a from among the second local wires W32. Also, a second nonvolatile memory device NV21 may be disposed in a region where the first local wire W31_1 crosses a second local wire W32_2 disposed secondly nearest to the first functional block 221a from among second local wires W32.

The local wire connection controller 222e may be connected to the first local wires W31 and program the nonvolatile memory devices included in the second local wire connection unit 222b. Thus, the local wire connection controller 222e may control a connection operation of the second local wire connection unit 222b. In the current example embodiment, the local wire connection controller 222e may share sixteen nonvolatile memory devices NV11 to NV44. The more nonvolatile memory devices that the local wire connection controller 222e shares, the longer time the local wire connection controller 222e needs to program the nonvolatile memory devices.

In the current example embodiment, the local wire connection controller 222e may be disposed above or below the second local wire connection unit 222b. Accordingly, the local wire connection controller 222e may share an area with the second local wire connection unit 222b, and the size of the second logic block 22 may thus be reduced, thereby reducing the whole size of the logic device 20.

Specifically, the local wire connection controller 222e may include first to fourth write decoders 2221a, 2221b, 2221c, and 2221d, and a write driver 2222. The first to fourth write decoders 2221a, 2221b, 2221c, and 2221d may be connected to the first local wires W31_1, W31_2, W31_3, and W31_3, respectively. The first to fourth write decoders 2221a, 2221b, 2221c, and 2221d may be commonly connected to the write driver 2222. In the current example embodiment, the first to fourth write decoders 2221a, 2221b, 2221c, and 2221d may be embodied as NMOS transistors that are turned on or off according to a control signal. The control logic 1100 is configured to output signals to gates of the first to fourth write decoders 2221a, 2221b, 2221c, and 2221d, respectively.

The write driver 2222 may provide write data to the first to fourth write decoders 2221a, 2221b, 2221c, and 2221d. The write driver 2222 may include the first to fourth write decoders 2221a, 2221b, 2221c, and 2221d and may thus share, for example, the sixteen nonvolatile memory devices NV11 to NV44. The more switch controllers the write driver 2222 shares, the longer time the write driver 2222 needs to program the nonvolatile memory devices.

Operations of the second local wire connection unit 222b and the local wire connection controller 222e will now be described in detail. The write driver 2222 may provide write data to the first to fourth write decoders 2221a, 2221b, 2221c, and 2221d. The first to fourth write decoders 2221a, 2221b, 2221c, and 2221d may be turned on or off according to a control signal to provide write data to the first local wires W31_1, W31_2, W31_3, and W31_4, respectively. The nonvolatile memory devices NV11 to NV44 may be programmed to '0' or '1', based on the differences between voltages of the first local wires W31_1, W31_2, W31_3, and W31_4 and the second local wires W32_1, W32_2, W32_3, and W32_4, respectively.

As described above, according example embodiments, a logic device may include a plurality of nonvolatile memory devices located in regions where a plurality of wires cross one another, respectively, and may program the plurality of nonvolatile memory devices in real time, thereby reconfiguring the operations of the logic device in real time. Unlike the existing logic devices, the logic device does not need an external memory device. Therefore, a time for loading data from an external memory device is not needed, and a high-performance logic device may be manufactured with low costs while reducing the size thereof.

Also, according example embodiments, a logic device may control routing between global wires by using a non-volatile latch that includes nonvolatile memory devices, and may control routing between local wires by using the nonvolatile memory devices. Accordingly, the efficiencies of the area and manufacturing costs of the logic device may be increasing by controlling routing between global wires and routing between local wires in a differential manner, thereby greatly improving the performance of the logic device.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A logic device comprising:
   at least two logic blocks including a first logic block and a second logic block;
   a global wire group including at least a plurality of first global wires connected to the first logic block and a plurality of second global wires connected to the second logic block; and
   a global controller including a plurality of first nonvolatile memory devices associated with at least one first global wire and one second global wire, the global controller configured to selectively couple the plurality of first global wires to the plurality of second global wires based on first data stored in the associated first nonvolatile memory devices, wherein the global controller includes,
   a global wire connection unit including the plurality of first nonvolatile memory devices, the global wire connection unit configured to connect the plurality of first global wires to the plurality of second global wires, and
   a global wire connection controller configured to control the global wire connection unit by programming the plurality of first nonvolatile memory devices in real time.

2. The logic device of claim 1, wherein the global wire connection unit comprises:
   a plurality of switching units coupled to the plurality of first global wires and the plurality of second global wires, respectively, wherein each of the plurality of switching units includes,
   a switch, and
   a switch controller including at least one of the plurality of first nonvolatile memory devices, the switch controller configured to control switching of the switch.

3. The logic device of claim 2, wherein the global wire connection controller is connected to at least one of the switch controllers.

4. The logic device of claim 2, wherein the global wire connection controller comprises:
   a plurality of write decoders connected to switch controllers adjacent to each other in a first direction; and
   a wire driver connected to the plurality of write decoders.

5. The logic device of claim 2, wherein the switch controller comprises:

a latch configured to read and store the first data stored in the at least one of the plurality of first nonvolatile memory devices.

6. The logic device of claim 2, wherein the switch controller further comprises:
a latch configured to read and store the first data stored in at least one pair of first nonvolatile memory devices from among the plurality of first nonvolatile memory devices.

7. The logic device of claim 6, wherein the latch comprises:
a first inverter including a first pull-up transistor connected to a power supply voltage terminal, and a first pull-down transistor connected to the first pull-up transistor in series;
a second inverter including a second pull-up transistor connected to the power supply voltage terminal, and a second pull-down transistor connected to the second pull-up transistor in series, the second inverter being cross-coupled to the first inverter; and
an equalizer configured to connect a gate of the first pull-down transistor to a gate of the second pull-down transistor, based on an equalization signal.

8. The logic device of claim 7, wherein the at least one pair of first nonvolatile memory devices are connected between a source of the first pull-down transistor and a ground voltage terminal and between a source of the second pull-down transistor and the ground voltage terminal, respectively.

9. The logic device of claim 7, wherein a node between the second pull-up transistor and the second pull-down transistor is connected to a control terminal of the switch, and the switch is opened based on a voltage of the node.

10. The logic device of claim 7, wherein the switch controller further comprises:
a first switch transistor connected to a source of the first pull-down transistor; and
a second switch transistor connected to a source of the second pull-down transistor.

11. The logic device of claim 10, wherein the global wire connection controller comprises:
a first write decoder connected to the plurality of first switch transistors;
a second write decoder connected to the plurality of second switch transistors; and
a write driver connected to the first and second write decoders.

12. A logic device comprising:
at least two logic blocks including a first logic block and a second logic block;
a global wire group including at least a plurality of first global wires connected to the first logic block and a plurality of second global wires connected to the second logic block; and
a global controller including a plurality of first nonvolatile memory devices associated with at least one first global wire and one second global wire, the global controller configured to selectively couple the plurality of first global wires to the plurality of second global wires based on first data stored in the associated first nonvolatile memory devices, wherein each of the at least two logic blocks includes,
at least two functional blocks including a first functional block and a second functional block,
a local wire group including a plurality of first local wires connected to the first functional block, and a plurality of second local wires connected to the second functional block, and
a local controller including a plurality of second nonvolatile memory devices associated with at least one first local wire and second local wire, the local controller configured to selectively couple the plurality of first global wires to the plurality of second local wires based on second data stored in the associated second nonvolatile memory devices.

13. The logic device of claim 12, wherein the local controller comprises:
a local wire connection unit including the plurality of second nonvolatile memory devices, the local wire connection unit configured to connect the plurality of first local wires to the plurality of second local wires; and
a local wire connection controller configured to control the local wire connection unit by programming the plurality of second nonvolatile memory devices.

14. The logic device of claim 13, wherein the local wire connection unit is above the local wire connection controller.

15. The logic device of claim 13, wherein the local wire connection unit is below the local wire connection controller.

16. The logic device of claim 13, wherein the local connection controller is configured to program the plurality of second nonvolatile memory devices and switch a connection between the plurality of first local wires and the plurality of second local wires based on the programming of the plurality of second nonvolatile memory devices, respectively.

17. The logic device of claim 16, wherein the local wire connection controller comprises:
a plurality of write decoders connected to the plurality of first local wires, respectively; and
a write driver connected to the plurality of write decoders.

18. The logic device of claim 12, wherein the plurality of second nonvolatile memory devices comprise resistive memory devices, wherein the differences between resistances of the resistive memory devices if the resistive memory devices are programmed to a first logic state and resistances of the resistive memory devices if the resistive memory devices are programmed to a second logic state, respectively, are greater than a value.

19. A logic device comprising:
at least two logic blocks including a first logic block and a second logic block; and
a global controller including a plurality of first nonvolatile memory devices and a plurality of switches associated with one of a plurality of first global wires connected to the first logic block and one of a plurality of second global wires connected to the second logic block, respectively, the global controller configured to selectively couple the plurality of first and second global wires by controlling the plurality of switches, based on first data stored in the associated plurality of first nonvolatile memory devices, wherein each of the at least two logic blocks includes,
at least two functional blocks having a first functional block and a second functional block, and
a local controller having a plurality of second nonvolatile memory devices associated with at least one of a plurality of first local wires connected to the first functional block and one of a plurality of second local wires connected to the second functional block, the local controller configured to selectively couple the plurality of first global wires to the plurality of second local wires based on second data stored in the associated plurality of second nonvolatile memory devices.

20. The logic device of claim 19, wherein the global controller comprises:
a global wire connection unit including the plurality of first nonvolatile memory devices, the global wire connection unit configured to connect the plurality of first global wires to the plurality of second global wires; and a global wire connection controller configured to control the global wire connection unit by programming the plurality of first nonvolatile memory devices.

21. The logic device of claim 19, wherein the local controller comprises:

a local wire connection unit including the plurality of second nonvolatile memory devices, the local wire connection unit configured to connect the plurality of first local wires to the plurality of second local wires; and a local wire connection controller configured to control the local wire connection unit by programming the plurality of second nonvolatile memory devices.

22. The logic device of claim 21, wherein the local wire connection unit is located above the local wire connection controller.

23. The logic device of claim 21, wherein the local wire connection unit is located below the local wire connection controller.

24. The logic device of claim 19, wherein the global controller further includes a plurality of latches configured to read and store the plurality of pieces of first data stored in the plurality of first nonvolatile memory devices, respectively.

25. The logic device of claim 19, wherein the plurality of first nonvolatile memory devices comprise at least one of resistive memory devices, magnetic memory devices, and flash memory devices.

26. The logic device of claim 19, wherein the plurality of second nonvolatile memory devices comprise resistive memory devices, wherein the differences between resistances of the resistive memory devices if the resistive memory devices are programmed to a first logic state and resistances of the resistive memory devices if the resistive memory devices are programmed to a second logic state, respectively, are greater than a threshold value.

* * * * *